United States Patent
Lin et al.

(10) Patent No.: US 8,051,558 B2
(45) Date of Patent: Nov. 8, 2011

(54) MANUFACTURING METHOD OF THE EMBEDDED PASSIVE DEVICE

(75) Inventors: Ting-Hao Lin, Taipei (TW); Chien-Wei Chang, Taoyuan (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 562 days.

(21) Appl. No.: 12/329,584

(22) Filed: Dec. 6, 2008

(65) Prior Publication Data

US 2009/0078576 A1    Mar. 26, 2009

Related U.S. Application Data

(62) Division of application No. 11/749,752, filed on May 17, 2007, now Pat. No. 7,573,721.

(51) Int. Cl.
*H05K 3/02* (2006.01)
*H05K 3/10* (2006.01)

(52) U.S. Cl. .............. 29/846; 29/825; 29/829; 29/831

(58) Field of Classification Search ............. 29/846, 29/25.42, 592.1, 825, 829, 831; 257/239, 257/532, E21.008, E27.048; 361/302–304, 361/306.1, 760, 766, 777
See application file for complete search history.

(56) References Cited

U.S. PATENT DOCUMENTS 5,459,633 A * 10/1995 Kosslowski et al. .......... 361/304
7,195,971 B2 * 3/2007 Bernstein et al. ............. 438/239

* cited by examiner

*Primary Examiner* — Thiem Phan

(57) ABSTRACT

A manufacturing method for mainly embedding the passive device structure in the printed circuit board is presented. In this structure, both the source electrode and the ground electrode of the passive device belong to the same level, and includes several source branches and several ground branches that are formed vertically on the inside of the dielectric layer of the circuit board which are connected, respectively, to avoid the conducting between the source electrode and the ground electrode during lamination. When it is in the form of the capacitor structure, through the use of the ultra-fine wiring technique, these source branches and ground branches are separated by a small gap between each other. Therefore, the side face area and quantities of the source branches and ground branches are both increased.

6 Claims, 4 Drawing Sheets

MANUFACTURING METHOD OF THE EMBEDDED PASSIVE DEVICE

CROSS-REFERENCES TO RELATED APPLICATIONS

This is a division of U.S. application Ser. No. 11/749,752, filed May 17, 2007, now U.S. Pat. No. 7,573,721 which is incorporated herewith by reference

BACKGROUND OF THE INVENTION

1. Field of the Invention

The present invention relates generally to an embedded passive device structure and manufacturing method thereof, and in particular, to an embedded passive device structure of higher electric value (such as, for example, capacitance) and manufacturing method thereof.

2. The Prior Arts

The so-called embedded passives or embedded passive devices, through using the thin core manufacture of the multilayer PCB, the etching or the printing processes are thereby carried out. And then the capacitors or the resistors are manufactured on the thin core directly. When after being laminated to become the multilayer PCB, the discrete passive devices which are welded on top of the board during assembly fabrication are thereby replaced, so as to save on board space for use by the active devices and their corresponding circuits.

The embedded, implanted or the buried technology which is started by the Ohmega-ply Company uses the matte side of the original copper-cladding on the innerlayer surface, and performs processing of the nickel phosphorus alloy layer at the upper thin film layer, which is regarded as the resistive element, and lamination to form the thin core. Then, the photoresist technology is used twice, as well as performing etching three times to form the required film "resistor" on a specific designated position. Because the above resistor is embedded inside the thin core, it is commonly known also as a Buried Resistor (BR).

Thereafter, in 1992, a PCB manufacturer in the U.S.A named Zycon® adds in an extremely thin (2-4 mil) dielectric layer as the thin core at the upper layers inside the multilayer PCB, which is outside of the original Vcc/GND thin core, and uses the vast area of the parallel copper sheet/foil of the thin core for manufacturing an integrated capacitor, with the tradename of Buried Capacitor™ (BC). It has advantages such as interference reduction, offering more charge capacity, and providing steady voltage while operating under fundamental frequencies. Zycon® Company had applied for several patents relating to the BC (namely, the U.S. Pat. Nos. 5,079,069, 5,161,086, and 5,155,655).

Generally, if needed to improve the capacitance of the capacitor in a case of under a stable voltage condition, other than the adoption of a high-k dielectric layer, a larger area of the source electrode, and of the ground electrode are also adopted. In other words, the source electrodes and ground electrodes should be as close to each other as possible. However, if the embedded capacitor structure from the Zycon® Company, were adopted because of the desire to adopt the ultra thin substrate, the manufacturing process is thereby difficult, and the yield is lower at the same time. Inside this capacitor structure, the source electrode, the ground electrode, and the dielectric layer are sequentially stacked. In addition, for achieving higher capacitance, the ground electrode and the source electrode are already very much close to each other. Thereafter, during the lamination process, because of the ease of exerting force upon the upper layers of the source or ground electrodes, it is conceivable to be able to embed some of the source electrodes or the ground electrodes into the dielectric layer, so as to make the source electrode and the ground electrode to form contact with each other, thereby resulting in fabricating the bad products. Although the conventional manufacturing technology was already dramatically improved upon by using the Zycon® method, however, under the general design criteria, the thickness of the dielectric layer at the minimum remains to be at 12 μm. As for adopting the high-k resin, the difficult part lies within the difficulty to control the final thickness during lamination after the printing steps, and to require to be using the copper sheet having low profile to avoid the problem of producing cohesion at the same time, such method is to make the reliability of the circuit board being put to the test.

SUMMARY OF THE INVENTION

The primary objective of this present invention is to provide an embedded passive device structure and manufacturing method thereof. In this structure, both the source electrode and the ground electrode of the passive device belong to the same level, thereby can avoid the unintentional conducting between the source electrode and the ground electrode during lamination. As the number of branchings for the source traces and the ground traces and the side face area have emassed a substantial quantity, the capacitance of the embedded passive device structure is dramatically improved.

The other objective of this present invention is to provide an embedded passive device structure and its manufacturing method. In the manufacturing process, the thin copper layer, capable of conducting electroplating current, is used to define the locations of the wiring layer by means of the patterned photoresist layer without requiring to form the trace wirings through etching. And instead, the electroplating method is performed for forming sequentially the required trace wiring or via hole structures, so as to improve the thin trace manufacturing capability. Thus, during or at the end of the manufacturing process, the thin copper layer, which is used to conduct the electroplating current, is to be removed for enlarging the wiring area to realize the objective of the high-density laminate PCB.

Another objective of this present invention is to provide an embedded passive device structure and its manufacturing method. Before filling the dielectric material in between the source electrode and the ground electrode, the source electrode and the ground electrode (the side face of the ground electrode in particular) are first roughened to enhance the bonding adhesion among the source, the dielectric layer, and the ground electrode, so as to improve product reliability.

According to the above objectives, the embedded passive device structure and its manufacturing method are mainly for the embedding of passive devices in printed circuit board. In this structure, both the source electrode and the ground electrode of the passive device belong to the same level, and include of a plurality of ground wire branches and source wire branches that are formed vertically inside the dielectric layer of the circuit board, and are mutually connected with the ground electrode and the source electrode, respectively, thus avoiding the unintended conducting between the source electrode and the ground electrode while being laminated. When it is in the form of the capacitor structure, through the use of the ultra-fine wiring technology, these source branches and ground branches are separated by a tiny gap between each other. Therefore, with the increase of the side face area and the quantities of the power source wire branches and ground wire branches, the capacitance of the embedded passive device structure is dramatically improved.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1A:
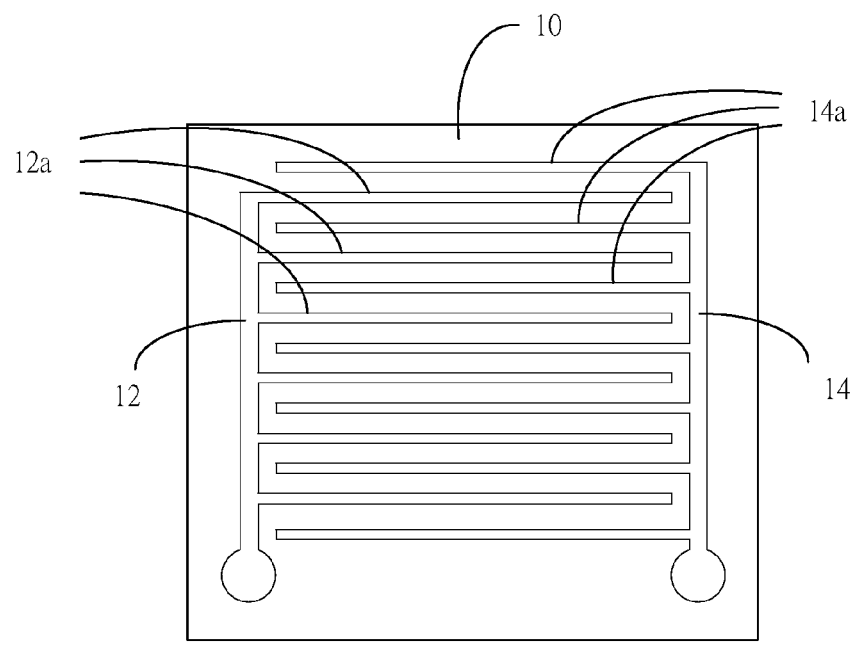
FIG. 1A to FIG. 1B are a plurality of schematic views showing the embedded passive device structure in accordance with an embodiment of the present invention.
Figure 1B:
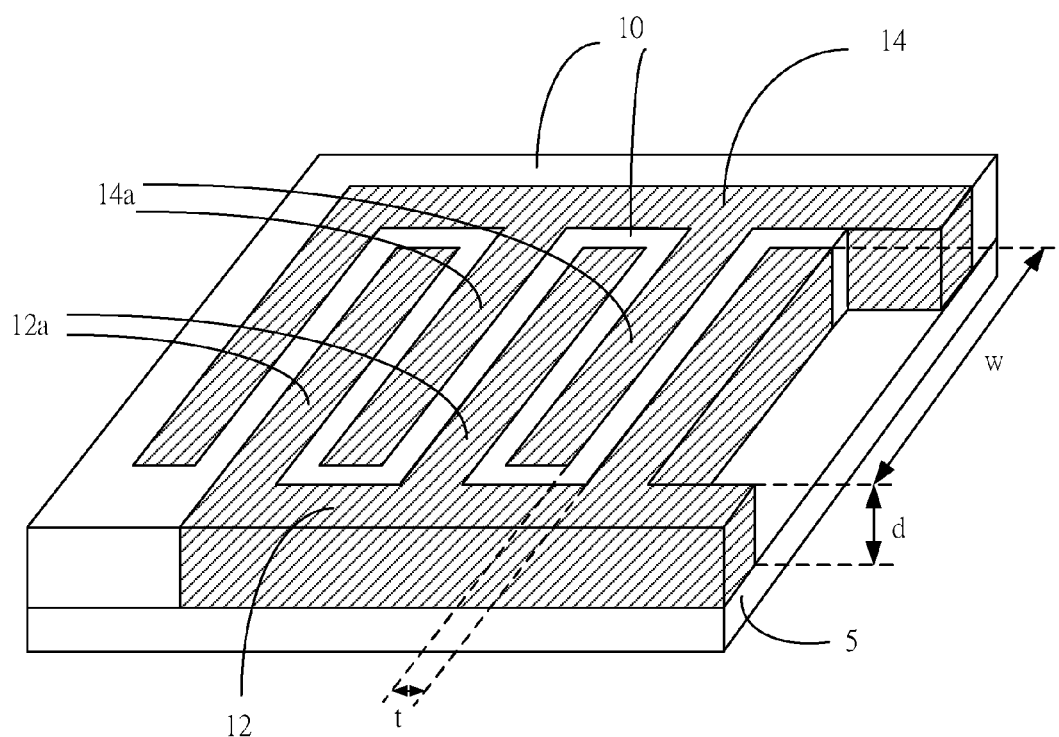

With reference to FIG. 1A~FIG. 1B, FIG. 1A to FIG. 1B are schematic views showing the embedded passive device structure in accordance with an embodiment of the present invention. As shown in FIG. 1A, when seen from the top view, the embedded passive device structure (which may be a capacitor, a resistor, or an inductor) in accordance with the embodiment of the present invention mainly includes a source electrode 12, a ground electrode 14, and a dielectric layer 10 filling in between and in the periphery of the source electrode 12 and the ground electrode 14. As seen from the top view, the source electrode 12 and the ground electrode 14 include a plurality of source branches 12a and ground branches 14a to be connected, respectively, in the form of a rake.

Briefly, to form the capacitor, the source branches 12a and the ground branches 14a are mainly arranged in a rake-like manner in which they must face each other across in pairs in a criss-cross fashion as shown in FIG. 1A. Otherwise, the source branches 12a and the ground branches 14a only require to be parallel to each other in pairs.

For example, as shown in FIG. 1B, in the embedded passive device structure in accordance with the embodiment of the present invention, the source electrode 12 and the ground electrode 14 both belong to the same level, and are formed on the same layer on a substrate 5, but are not formed in the stacked up fashion as found in the conventional technology, thereby avoiding the problem of having unintentionally electrically conducting between the source electrode and the ground electrode when being hot laminated. In this structure, to increase such as capacitance in a limited space to a larger scale, the source electrode 12 and the ground electrode 14 are coupled to the source branches 12a and the ground branches 14a, which are vertically formed on the inside of the dielectric layer 10 of the printed circuit board, respectively.

While forming the above branches, through the use of the ultra-fine wiring process, the source branches 12a and the ground branches 14a are separated by a small gap (t) from each other. By increasing the side face area (A=w×d) and the quantities of the number of source branches 12a and ground branches 14a, the capacitance of the embedded passive device structure is improved. In addition, the dielectric layer 10 can use high-k material for increasing the capacitance. In other words, for the source branch 12a and the ground branches 14a which are correspondingly formed, whenever one pair is being added each time, the side face area is doubled, and the capacitance is doubled thereupon. In a word, it is estimated that the capacitance density per unit area of the embedded passive device structure can increase to more than triple of the conventional level. The manufacturing method of the embedded passive device structure in accordance with the embodiment of the present invention will be further described below.

In the embodiment according to the present invention, the gap (t) in between the source branches 12a and the ground branches 14a has a dramatic influence on the capacitance, so that a non-conventional ultra-fine wiring process must be used, by reducing the gap (t) by a large scale to increase the capacitance. For this reason, the wiring process in the manufacturing method of the present invention has preferred to use electroplating to form the circuits, and therefore does not rely on etching. Certainly, to form the structures as shown in FIG. 1A~FIG. 1B, no matter whether electroplating or etching method were used, both are included within the spirit of the present invention. The following described method for electroplating does not serve to limit the manufacturing method according to the present invention.

Figure 2A:
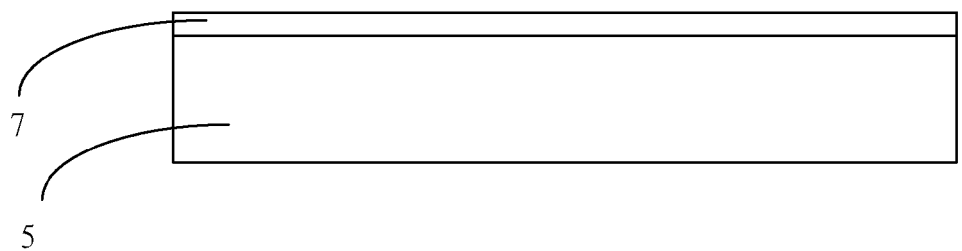
FIG. 2A to FIG. 2G are a plurality of section views showing the manufacturing of the embedded passive device in accordance with the embodiment of the present invention.
Figure 2B:
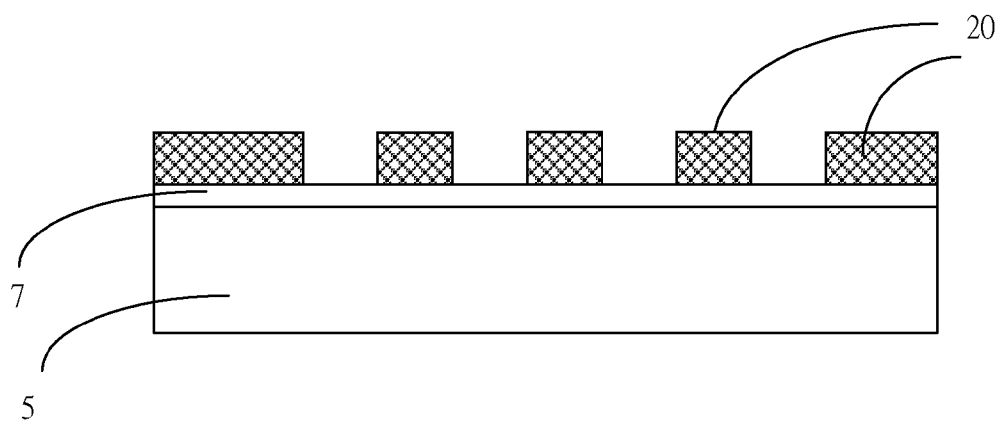
Figure 2C:
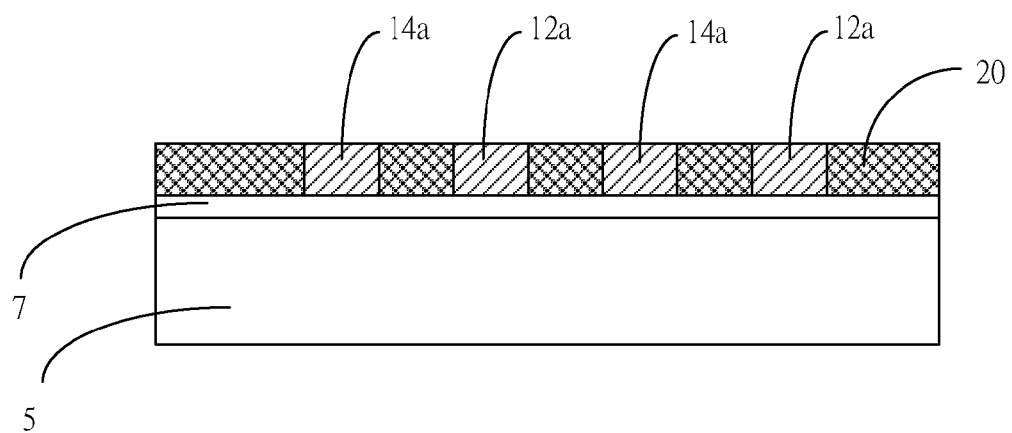
Figure 2D:
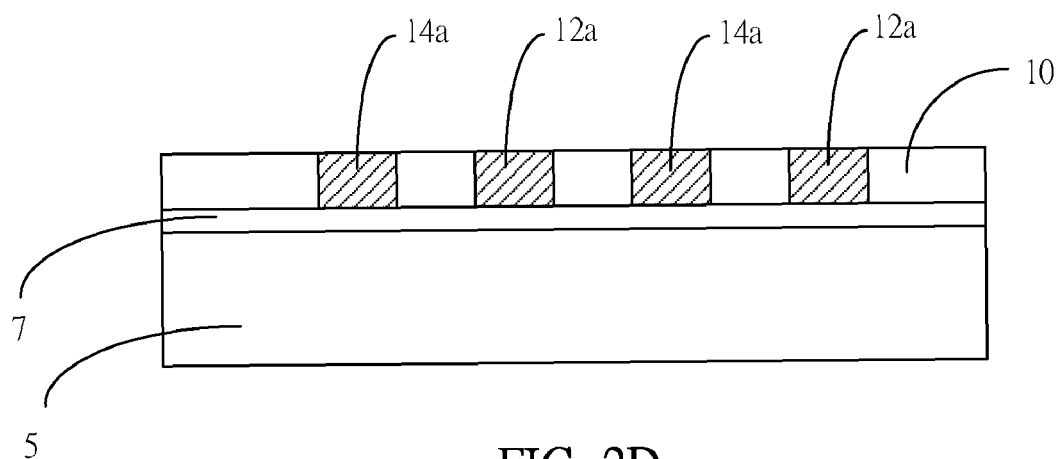

Referring to FIG. 2A~FIG. 2G, FIG. 2A to FIG. 2G are a plurality of section views showing the manufacturing of the embedded passive device in accordance with the present invention. As shown in FIG. 2A, the substrate 5 is provided at first, and a thin copper layer 7 which can conduct electroplating current, has been already formed on the substrate 5. Then, to define the source electrode 12 and the ground electrode 14 of the passive device structure (including the source branches 12a and the ground branches 14a connected with each other) as shown in FIG. 1A or in FIG. 1B, on the thin copper layer 7 of the substrate 5, the patterned photoresist layer 20 is formed on the thin copper layer 7 of the substrate 5, as shown in FIG. 2B. As shown in FIG. 2C, through the using the electroplating current which is conducted by the thin copper layer 7 and the patterned photoresist layer 20, the source electrode 12 and the ground electrode 14 are formed on the thin copper layer 7; and then the patterned photoresist layer 20 is removed. Thereafter, inside the gap left after removing the patterned photoresist layer 20 (mainly inside the gap between the source branches 12a and the ground branches 14a), the dielectric layer 10 made of high-k dielectric material is filled on the thin copper layer 7.

To promote bonding between the source electrode 12, the ground electrode 14, and the dielectric layer 10, before the high-k dielectric layer 10 is filled on the thin copper layer 7, the source electrode 12 and the ground electrode 14 (the side faces of the source branches 12a and the ground branches 14a in particular) are roughened.

Figure 2E:
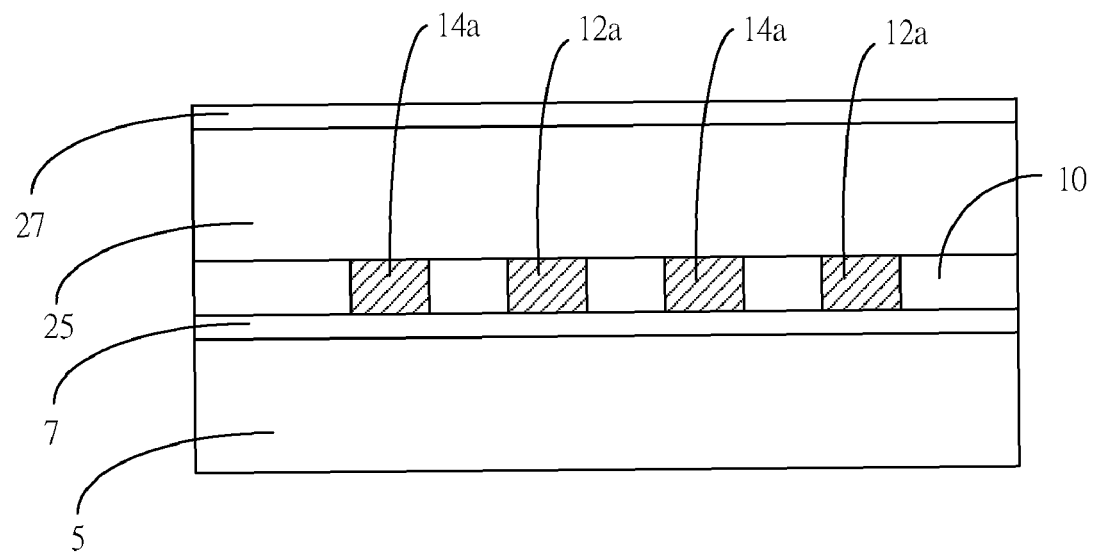
Figure 2F:
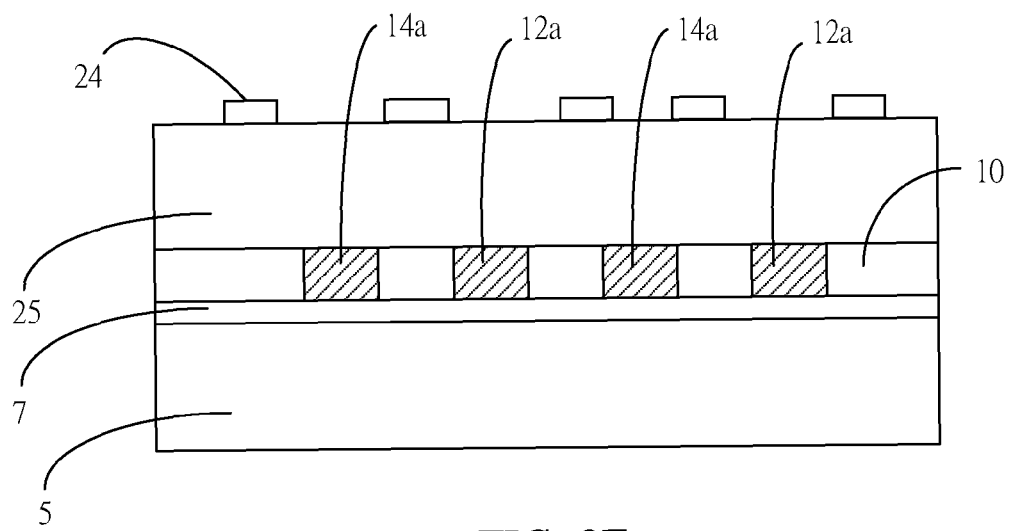
Figure 2G:
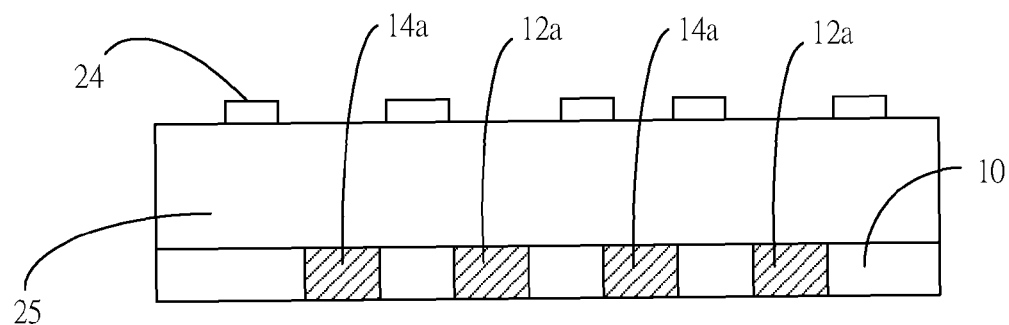

After finishing roughening the source electrode 12 and the ground electrode 14 (or not be roughened), as shown in FIG. 2E, the insulating layer 25 along with the metal layer 27 are hot laminated on the source electrode 12, the ground electrode 14, and the dielectric layer 10. And then the metal layer 27 is patternized to form a plurality of wiring 24 as shown in FIG. 2F. Finally, while during or at the end of the manufacturing process, the thin copper layer 7, which is to conduct the electroplating current, is removed to enlarge the wiring area, so as to realize the object of the high density PCB.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A manufacturing method of the embedded passive device, for embedding the embedded passive devices in the printed circuit board, comprising:

provuing a substrate, a thin copper layer formed on the substrate, and the thin copper layer is able to conduct electroplating current;

forming a patterned photoresist layer on the thin copper layer of the substrate; the patterned photoresist layer defining a source electrode and a ground electrode in the passive device, and the source electrode and the ground electrode both belonging to the same level and including a plurality of source branches and ground branches connected to the source electrode and the ground electrode, respectively;

using the patterned photoresist layer, performing electroplating on the thin copper layer to form the source electrode and the ground electrode;

removing the patterned photoresist layer; and filling a dielectric layer made of high-k dielectric material on the thin copper layer inside the gap between the source branches and the ground branches, wherein the source branches and the ground branches are separated by a predetermined gap, and the source branches and the ground branches both have a predetermined depth and a predetermined width.

2. The manufacturing method as claimed in claim 1, wherein the embedded passive device structure is in the form of a capacitor, a resistor, or an inductor.

3. The manufacturing method as claimed in claim 1, wherein the source branches and the ground branches are arranged in a rake-like wiring pattern, and are facing each other in pairs in a criss-cross fashion.

4. The manufacturing method as claimed in claim 1, wherein the source branches and the ground branches are parallel to each other in pairs.

5. The manufacturing method as claimed in claim 1, wherein before filling the dielectric layer made of the high-k dielectric material on the thin copper layer to form the dielectric layer, the source electrode and the ground electrode are both roughened.

6. The manufacturing method as claimed in claim 1, further comprising:

laminating an insulating layer along with a metal layer on the source electrode, the ground electrode, and the dielectric layer;

patterning the metal layer to form a plurality of wiring; and removing the substrate and the thin copper layer on the substrate.

* * * * *